United States Patent [19]
Barrett, Jr. et al.

[11] Patent Number: 5,630,222
[45] Date of Patent: May 13, 1997

[54] METHOD AND APPARATUS FOR GENERATING MULTIPLE SIGNALS AT MULTIPLE FREQUENCIES

[75] Inventors: Raymond L. Barrett, Jr., Lauderdale; Barry W. Herold, Boca Raton; Grazyna A. Pajunen, Delray Beach, all of Fla.

[73] Assignee: Motorola Inc., Schaumburg, Ill.

[21] Appl. No.: 566,518

[22] Filed: Dec. 4, 1995

[51] Int. Cl.[6] .................................................. H04B 1/14
[52] U.S. Cl. .......................... 455/260; 455/265; 327/105; 327/147; 331/2; 375/376
[58] Field of Search .......................... 455/75, 76, 165.1, 455/183.1, 183.2, 258, 259, 260, 265; 375/375, 376; 331/2; 327/147, 151, 105, 107

[56] References Cited

U.S. PATENT DOCUMENTS

| | | | |
|---|---|---|---|
| 3,212,023 | 10/1965 | Broadhead | 331/11 |
| 4,114,110 | 9/1978 | Nossen | 331/2 |
| 4,167,711 | 9/1979 | Smoot | 331/17 |
| 4,399,560 | 8/1983 | Watkinson | 455/260 |
| 4,602,225 | 7/1986 | Miller et al. | 332/19 |
| 4,607,393 | 8/1986 | Nolde et al. | 455/208 |
| 4,901,036 | 2/1990 | Herold et al. | 331/25 |
| 5,373,256 | 12/1994 | Nicotra et al. | 331/2 |
| 5,535,432 | 7/1996 | Dent | 455/77 |
| 5,552,750 | 9/1996 | Barrett et al. | 331/25 |

*Primary Examiner*—Reinhard J. Eisenzopf
*Assistant Examiner*—Lee Nguyen
*Attorney, Agent, or Firm*—Gregg Rasor

[57] ABSTRACT

A frequency synthesizer (100) is used for generating a plurality of signals operating at a plurality of frequencies that are integer multiples of a reference frequency. The frequency synthesizer (100) includes a plurality of phase lock loops coupled to a single phase error detector. The phase error detector (103) is connected to a reference signal (104), a first generated signal (116) and a sampler signal (136) derived from a second generated signal (132). The phase error detector (103) includes a shared counter (118), and first and second registers (106, 122) connected to the output of the shared counter (118). First and second phase lock loops (101, 105) are used for phase locking to the reference signal (104). The first and second phase lock loops (101, 105) derive phase error signals from the first and second registers (106, 122), thereby adjusting the first and second generated signals (116, 132).

21 Claims, 4 Drawing Sheets

METHOD AND APPARATUS FOR GENERATING MULTIPLE SIGNALS AT MULTIPLE FREQUENCIES

FIELD OF THE INVENTION

This invention relates in general to frequency synthesizers, and more specifically to a frequency synthesizer for generating a plurality of signals operating at a plurality of frequencies that are integer multiples of a reference frequency.

BACKGROUND OF THE INVENTION

Phase lock loops commonly have been utilized in communication devices for generating signals phase locked to a reference frequency. For example, a dual-conversion receiver needs two injection signals that are not necessarily harmonically related. Similarly, a transceiver, which might include the dual conversion receiver, may need a third frequency for exciting the transmitter. In addition, a microprocessor that is used for processing radio signals of the transceiver may need yet another frequency as a clock signal for general operation.

In the past, multiple signals that were not harmonically related typically have required multiple phase lock loops. These implementations have required multiple external reference oscillators, which have been costly and have affected manufacturing quality of communication devices. Moreover, multiple phase lock loops consume power and integrated circuit (IC) real estate. Portable communication devices that are battery operated are adversely affected as to battery life, by utilizing a plurality of independent phase lock loops.

Thus, whenever multiple phase lock loops are required, it is desirable to combine portions of the multiple phase lock loops, where possible, to reduce power consumption and to minimize IC real estate. What is needed, then, is a frequency synthesizer for generating a plurality of signals operating at a plurality of frequencies. In particular, the frequency synthesizer should consume less power, and use less IC real estate than prior art frequency synthesizers using multiple phase lock loops.

SUMMARY OF THE INVENTION

An aspect of the present invention is a method of producing a plurality of generated signals operating at a plurality of generated frequencies that are integer multiples of a reference frequency at which a reference signal operates. The method utilizes a phase error detector comprising a shared counter. The method comprises the step of generating a first generated signal operating at a first frequency in a first phase lock loop, comprising in the phase error detector the steps of counting transitions of the first generated signal, and coincident with a predetermined edge of the reference signal, producing a first count value representing a first phase correction signal for correcting the first frequency. The method further comprises the step of simultaneously generating a second generated signal operating at a second frequency in a second phase lock loop, comprising in the phase error detector the step of producing, coincident with a predetermined transition of a sampler signal operating at a sampler frequency and derived from the second generated signal, a second count value representing a second phase correction signal for correcting the second frequency.

A second aspect of the present invention is an apparatus for producing a plurality of generated signals operating at a plurality of generated frequencies that are integer multiples of a reference frequency at which a reference signal operates. The apparatus comprises a phase error detector coupled to the reference signal and coupled to a sampler signal operating at a sampler frequency and derived from a second generated signal, the phase error detector comprising a shared counter coupled to a first generated signal. A first phase lock loop is coupled to the phase error detector for generating the first generated signal operating at a first frequency, and a second phase lock loop coupled to the phase error detector for simultaneously generating the second generated signal operating at a second frequency. The shared counter counts transitions of the first generated signal, and coincident with a predetermined edge of the reference signal, the phase error detector produces a first count value representing a first phase correction signal for correcting the first frequency. The phase error detector further produces, coincident with a predetermined transition of the sampler signal, a second count value representing a second phase correction signal for correcting the second frequency.

A third aspect of the present invention is a communication receiver. The communication receiver comprises an antenna for intercepting a radio signal including a message, a receiver element coupled to the antenna for demodulating the message, a processor coupled to the receiver element for processing the message, a user control coupled to the processor for providing control of the communication receiver by a user, and a display coupled to the processor for displaying the message. The receiver element includes a reference oscillator for generating a reference signal operating at a reference frequency, and a frequency synthesizer for producing a plurality of generated signals operating at a plurality of generated frequencies that are integer multiples of the reference frequency. The frequency synthesizer comprises a phase error detector coupled to the reference signal and coupled to a sampler signal operating at a sampler frequency and derived from a second generated signal, the phase error detector comprising a shared counter coupled to a first generated signal. A first phase lock loop is coupled to the phase error detector for generating the first generated signal operating at a first frequency, and a second phase lock loop coupled to the phase error detector for simultaneously generating the second generated signal operating at a second frequency. The shared counter counts transitions of the first generated signal, and coincident with a predetermined edge of the reference signal, the phase error detector produces a first count value representing a first phase correction signal for correcting the first frequency. The phase error detector further produces, coincident with a predetermined transition of the sampler signal, a second count value representing a second phase correction signal for correcting the second frequency.

DESCRIPTION OF THE PREFERRED EMBODIMENT

Figure 1:
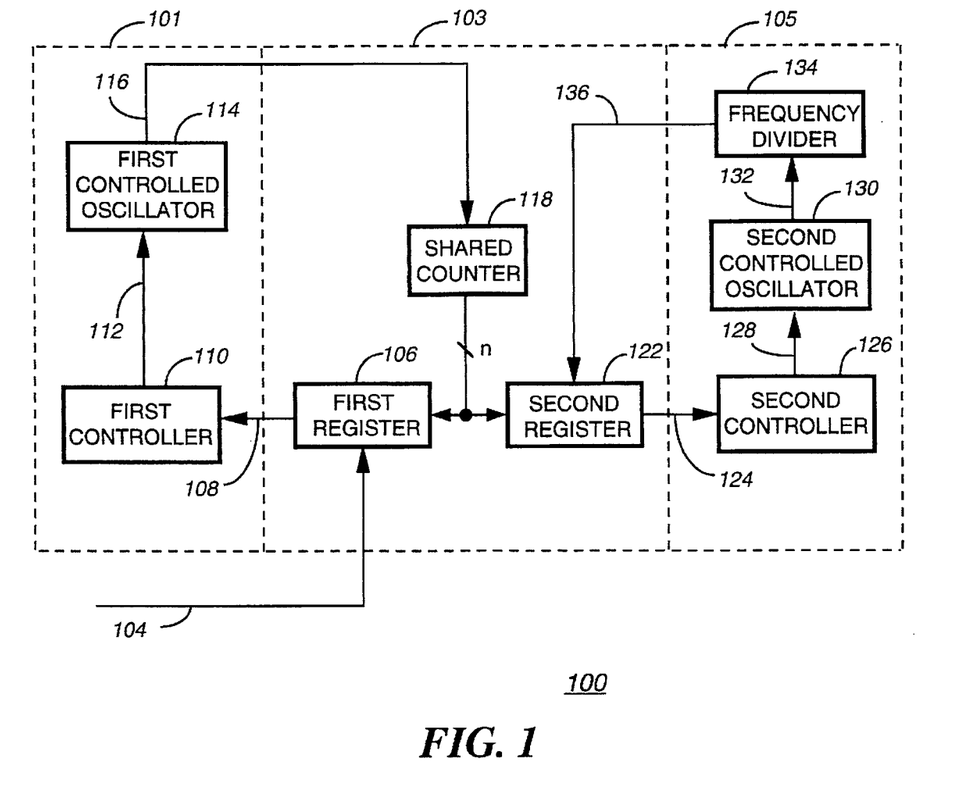
FIG. 1 is an electrical block diagram of a frequency synthesizer in accordance with the preferred embodiment of the present invention.

FIG. 1 is an electrical block diagram of a frequency synthesizer 100 in accordance with the preferred embodiment of the present invention. The frequency synthesizer 100 is for producing a plurality of generated signals operating at a plurality of generated frequencies that are integer multiples of a reference signal 104 operating at a reference frequency. The frequency synthesizer 100 comprises a phase error detector 103, a first phase lock loop 101, and a second phase lock loop 105.

The first phase lock loop 101 is coupled to the phase error detector 103, and is utilized for generating the first generated signal 116 operating at a first frequency. Similarly, the second phase lock loop 105 is coupled to the phase error detector 103 for simultaneously generating the second generated signal 132 operating at a second frequency.

The phase error detector 103 is coupled to the reference signal 104, is coupled to a sampler signal 136, and is coupled to the first generated signal 116. Coincident with a predetermined edge of the reference signal 104, the phase error detector 103 produces a first count value 108 representing a first phase correction signal for correcting the first frequency. Also coincident with a predetermined edge of the sampler signal 136, the phase error detector 103 produces a second count value 124 representing a second phase correction signal for correcting the second frequency.

The phase error detector 103 comprises a shared counter 118, a first register 106, and a second register 122. The shared counter 118 is coupled to the first generated signal 116 for counting transitions of the first generated signal 116. The shared counter 118 preferably has K sequential states, K being a first integer value equal to the first frequency of the first generated signal 116 divided by the reference frequency of the reference signal 104. The shared counter 118 is preferably implemented with a conventional Johnson Counter in order to minimize power consumption, and reduce the number of bit transitions to one bit per clock cycle of the first generated signal 116. It will be appreciated that other conventional counter architectures that achieve similar power consumption characteristics and bit transitions can be used in place of the Johnson Counter.

The input of the first register 106 is coupled to the output value 120 of the shared counter 118, and the register enable is coupled to the reference signal 104. The first register 106 is a conventional edge-triggered register, which is utilized for recording the first count value 108 coincident with the predetermined edge of the reference signal 104. The first register 106 preferably has a bit width corresponding to n-bits conforming with the expression n=logK/log2 (rounded upward to the next integer value).

The input of the second register 122 is coupled to the output value 120 of the shared counter 118, and the register enable is coupled to the sampler signal 136. The second register 122 is a conventional edge-triggered register, which is utilized for recording the second count value 124 coincident with the predetermined transition of the sampler signal 136. The second register 122 preferably has a bit width corresponding to n-bits conforming with the expression n=logK/log2 (rounded upward to the next integer value).

The first phase lock loop 101 comprises a first controlled oscillator 114, and a first controller 110. The first controlled oscillator 114 is coupled to a first control signal 112 for producing the first generated signal 116 operating at the first frequency, as determined by the first control signal 112. The first controller 110 is coupled to the first controlled oscillator 114, and coupled to the first register 106. The first controller 110 is used for processing the first count value 108 to generate the first control signal 112.

The second phase lock loop 105 comprises a second controlled oscillator 130, a frequency divider 134, and a second controller 126. The second controlled oscillator 130 is coupled to a second control signal 128 for producing the second generated signal 132 operating at the second frequency, as determined by the second control signal 128.

The frequency divider 134 is a conventional frequency divider coupled to the second controlled oscillator 130 and coupled to the second register 122. The frequency divider 134 is utilized for frequency dividing a frequency value of the second generated signal 132 by N to produce the sampler signal 136, wherein N is a second integer value equal to the second frequency value of the second generated signal 132 divided by the reference frequency value of the reference signal 104. The second controller 126 is coupled to the second register 122, and coupled to the second controlled oscillator 130. The second controller 126 is utilized for processing the second count value 124 to generate the second control signal 128.

It will be appreciated that, if needed, additional registers similar to the second register 122 can be added to the phase error decoder 103 for interconnection with additional phase lock loops similar to the second phase lock loop 105 (but having different frequency divider parameters) for providing additional generated signals at additional frequencies that are integer multiples of the reference frequency.

Figure 2:
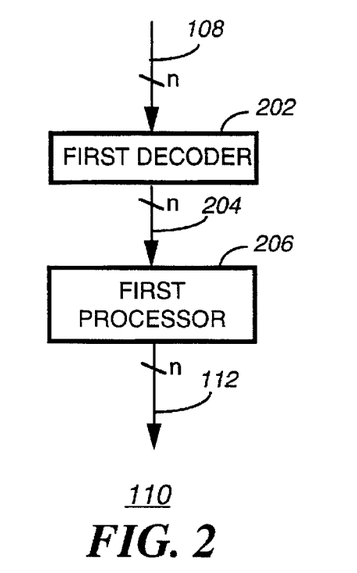
FIG. 2 is an electrical block diagram of the first controller in accordance with the preferred embodiment of the present invention.

FIG. 2 is an electrical block diagram of the first controller 110 in accordance with the preferred embodiment of the present invention. The first controller 110 comprises a first decoder 202, and a first processor 206. The first decoder 202 is coupled to the first register 106 for decoding the first count value 108 for deriving a first sequential state number $S_1$ corresponding to the first count value 108. The first decoder 202 is preferably implemented with conventional combinational logic for decoding the sequences generated by the shared counter 118.

The first processor 206 is coupled to the output value 204 of the first decoder 202. The first processor 206 is utilized for determining the first phase correction signal corresponding to the first sequential state number to be $$A(S_1 - P_1)/K,$$

wherein A is a predetermined gain constant, and wherein $P_1$ is a first predetermined sequential state number corresponding to a desired point of phase lock between the reference signal 104 and the first generated signal 116.

The first processor 206 is programmed for computing the first control signal 112 in response to the first phase correction signal by performing a discrete time digital process. The discrete time digital process is preferably a digital derivation of a lead-lag filter network conforming to the first controller transfer function $$H_{fc}(z) = 1 + \left( \frac{1}{1-z^{-1}} \right).$$

To implement this transfer function, the first processor 206 utilizes conventional digital logic hardware. Once the first phase correction signal has been applied to the lead-lag filter network, the result is then applied to a conventional current-based digital-to-analog converter (IDAC), not shown), which generates the first control signal 112.

Figure 3:
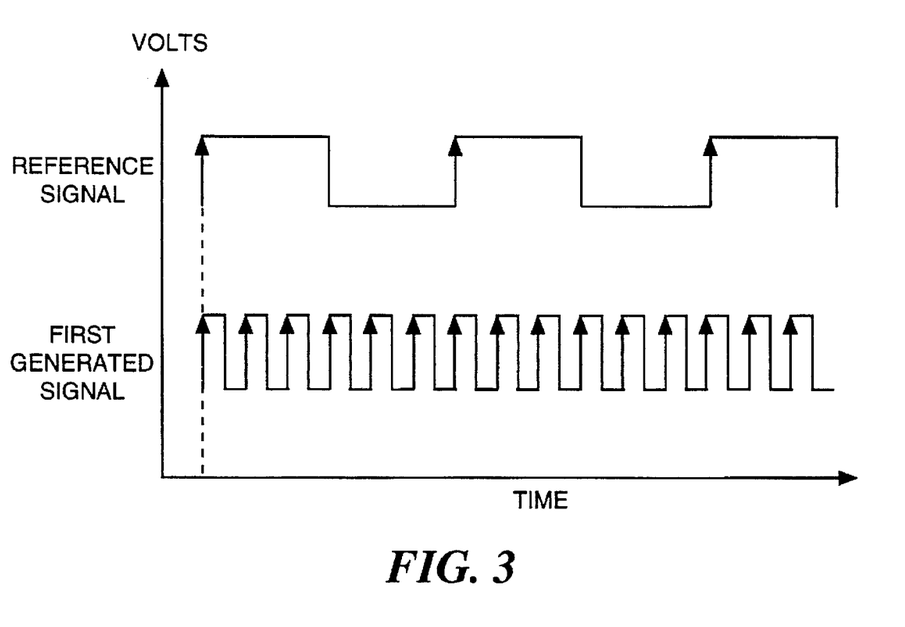
FIG. 3 is a timing diagram depicting operation of the phase detector as used by the first phase lock loop in accordance with the preferred embodiment of the present invention.

FIG. 3 is a timing diagram depicting operation of the phase error detector 103 as used by the first phase lock loop in accordance with the preferred embodiment of the present invention. The timing diagram includes timing signals for the reference signal 104 and the first generated signal 116 (not to scale). In this example, each rising edge of the reference signal 104 records the output value 120 of the shared counter 118 in the first register 106. If the first generated signal 116 is precisely in phase lock with the reference signal 104, the first register 106 will record the same state $S_1$, as translated by the first decoder 202, on every rising edge of the reference signal 104. Assuming for instance the number of states of the shared counter 118 is one hundred (i.e., K=100) and the desired state of the shared counter 118 at lock ($P_1$) is 50, then for this example $S_1$=50 (i.e., zero phase difference). Inset, ting these numbers into the above equation calculates a phase error of $$\frac{50-50}{100} \times 360° = 0°.$$

If the first generated signal 116 should drift slightly out of precise phase lock with the reference signal 104, the first register 106 will record a state $S_1$ that is higher or lower than the desired state $P_1$, and the above equation will compute a non-zero phase error to correct the phase of the first generated signal 116.

Depending on required system gain, the first processor 206 calculates the phase error (as described above) and multiplies the phase error by the gain factor A to generate the first phase correction signal. The first phase correction signal is then applied to the transfer function of the first controller 110, and the result is then applied to the IDAC, which generates the first control signal 112.

Figure 4:
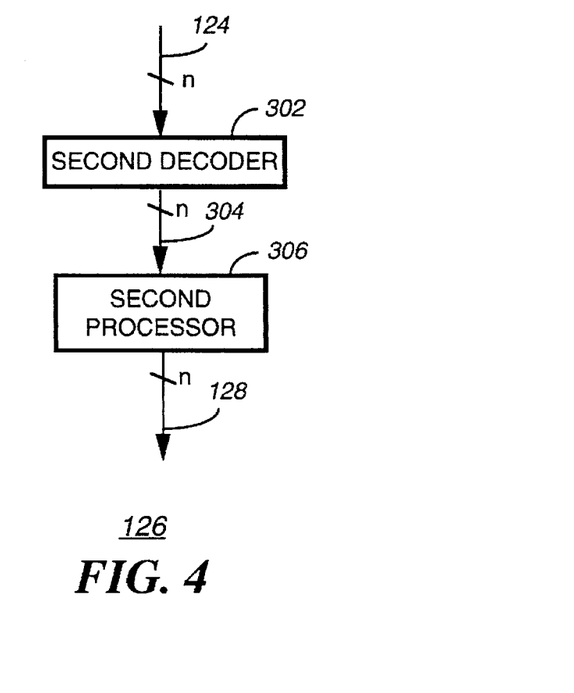
FIG. 4 is an electrical block diagram of the second controller in accordance with the preferred embodiment of the present invention.

FIG. 4 is an electrical block diagram of the second controller 126 in accordance with the preferred embodiment of the present invention. The second controller 126 comprises a second decoder 302, and a second processor 306. The second decoder 302 is coupled to the second register 122 for decoding the second count value 124 for deriving a second sequential state number $S_2$ corresponding to the second count value 124. The second decoder 302 is preferably implemented with conventional combinational logic for decoding the sequences generated by the shared counter 118.

The second processor 306 is coupled to the output value 304 of the second decoder 302. The second processor 306 is utilized for determining the second phase correction signal corresponding to the second sequential state number to be $$B(S_2-P_2)/K,$$

wherein B is a predetermined gain constant, and wherein $P_2$ is a second predetermined sequential state number corresponding to a desired point of phase lock between the reference signal 104 and the second generated signal 132.

The second processor 306 is programmed for computing the second control signal 128 in response to the second phase correction signal by performing a discrete time digital process. The discrete time digital process is preferably a digital derivation of a lead-lag filter network conforming to the second controller transfer function $$H_{sc}(z) = 1 + \left( \frac{1}{1-z^{-1}} \right).$$

To implement this transfer function, the second processor 306 utilizes conventional digital logic hardware. Once the second phase correction signal has been applied to the lead-lag filter network, the result is then applied to a conventional current-based digital-to-analog converter (IDAC), which generates the second control signal 128.

Figure 5:
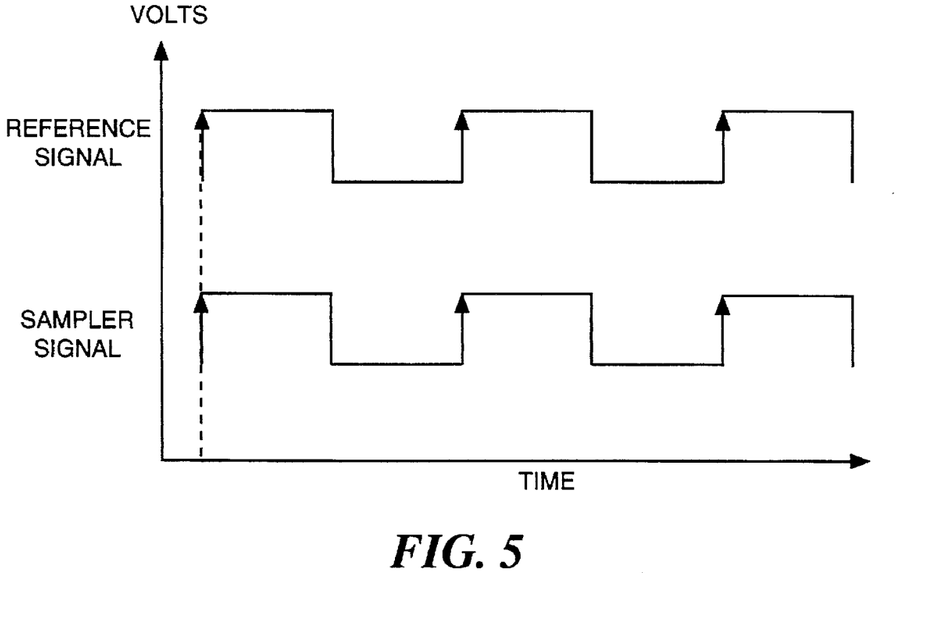
FIG. 5 is a timing diagram depicting operation of the phase detector as used by the second phase lock loop in accordance with the preferred embodiment of the present invention.

FIG. 5 is a timing diagram depicting operation of the phase error detector 103 as used by the second phase lock loop 105 in accordance with the preferred embodiment of the present invention. The timing diagram includes timing signals for the reference signal 104 and the sampler signal 136. The operational description of this timing diagram and the functional elements of the second controller 126 are the same as given in FIG. 3, with the exception that the locking signal is the sampler signal 136, and the second processor 306 applies a different phase error formula, $B(S_2-P_2)/K$.

Figure 6:
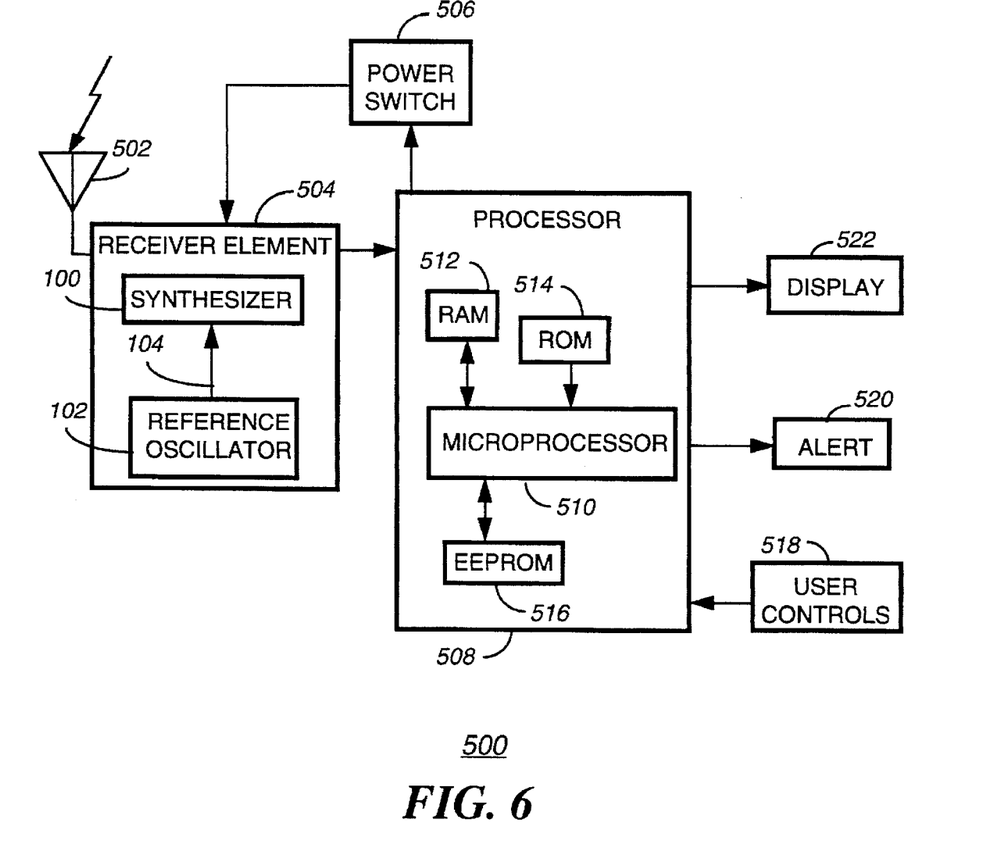
FIG. 6 is an electrical block diagram of a communication receiver in accordance with the preferred embodiment of the present invention.

FIG. 6 is an electrical block diagram of a communication receiver 500 in accordance with the preferred embodiment of the present invention. The communication receiver 500 includes an antenna 502 for intercepting radio frequency (RF) signals comprising messages from a transmitting station (not shown). The antenna 502 is coupled to a receiver element 504 applying conventional demodulation techniques for receiving the RF signals. Once the RF signals have been demodulated, the receiver element 504 generates demodulated message information which is presented to a processor 508 for processing.

The receiver element 504 includes the frequency synthesizer 100 in accordance with the present invention, and a reference oscillator 102. The frequency synthesizer 100 is used for generating the proper operational signals utilized by the demodulation circuits of the receiver element 504. The frequency synthesizer 100 is coupled to the reference oscillator 102, which is used for generating the reference signal 104 operating at the reference frequency. It will be appreciated that the frequency synthesizer 100 can also be used for generating a clock signal for the processor 508.

A conventional power switch 506, coupled to the processor 508, is used to control the supply of power to the receiver element 504, thereby providing a battery saving function. To perform the necessary functions of the communication receiver 500, the processor 508 includes a microprocessor 510, a random access memory (RAM) 512, a read-only memory (ROM) 514, and an electrically erasable programmable read-only memory (EEPROM) 516.

Preferably, the microprocessor 510 is similar to the M68HC08 microcontroller manufactured by Motorola, Inc. It will be appreciated that other similar processors can be utilized for the microprocessor 510, and that additional processors of the same or alternative type can be added as required to handle the processing requirements of the processor 508. It will also be appreciated that other types of memory, e.g., EEPROM or FLASH, can be utilized for the ROM 514, as well as the RAM 512. It will be further appreciated that the RAM 512 and the ROM 514, singly or in combination, can be manufactured as an integral portion of the processor 508.

The processor 508 is programmed by way of the ROM 514 to process incoming messages transmitted by the transmitting station. During message processing, the processor 508 decodes in a conventional manner an address in the demodulated message information, compares the decoded address with one or more addresses stored in the EEPROM 516, and when a match is detected, the processor 508 proceeds to process the remaining portion of the message.

Once the processor 508 has processed the message, it stores the message in the RAM 512, and a call alerting signal is generated to alert a user that a message has been received. The call alerting signal is directed to a conventional audible or tactile alerting device 520 for generating an audible or tactile call alerting signal.

The message can be accessed by the user through user controls 518, which provide functions such as lock, unlock, delete, read, etc. More specifically, by the use of appropriate functions provided by the user controls 518, the message is recovered from the RAM 512, and then conveyed to the user by way of an information interface comprising a display 522 for displaying the message, e.g., a conventional liquid crystal display (LCD).

Thus, it should be apparent by now that the present invention provides a method and apparatus for generating a plurality of signals operating at a plurality of frequencies that are integer multiples of a reference frequency. In particular, the present invention advantageously provides a novel frequency synthesizer which utilizes a single phase detector for multiple phase lock loops. This architecture provides an efficient use of integrated circuit (IC) real estate, thereby reducing cost and improving manufacturing quality. Moreover, the counter utilized in the phase detector accounts for a large portion of the power consumption of the phase lock loops. By sharing the counter of the phase detector amongst a plurality of phase lock loops, a significant reduction in the power consumption of the frequency synthesizer is realized.

What is claimed is:

1. A method of producing a plurality of generated signals operating at a plurality of generated frequencies that are integer multiples of a reference frequency at which a reference signal operates, the method utilizing a phase error detector comprising a shared counter, the method comprising the step of:

generating a first generated signal operating at a first frequency in a first phase lock loop, comprising in the phase error detector the steps of:
 counting transitions of the first generated signal, and coincident with a predetermined edge of the reference signal, producing a first count value representing a first phase correction signal for correcting the first frequency, wherein the method further comprises the step of simultaneously generating a second generated signal operating at a second frequency in a second phase lock loop, comprising in the phase error detector, the step of producing, coincident with a predetermined transition of a sampler signal operating at a sampler frequency and derived from the second generated signal, a second count value representing a second phase correction signal for correcting the second frequency.

2. The method of claim 1, wherein the step of generating the first generated signal further comprises the steps of:

producing the first generated signal in a first controlled oscillator operating at the first frequency, as determined by a first control signal;

recording the first count value coincident with the predetermined edge of the reference signal; and processing the first count value in a first controller to generate the first control signal.

3. The method of claim 2, wherein the shared counter has K sequential states, K being a first integer value equal to the first frequency divided by the reference frequency, and wherein the step of processing the first count value comprises the steps of:
 decoding the first count value to derive a first sequential state number $S_1$ corresponding to the first count value; and
 determining the first phase correction signal corresponding to the first sequential state number to be $$A(S_1-P_1)/K,$$

wherein A is a predetermined gain constant, and wherein $P_1$ is a first predetermined sequential state number corresponding to a desired point of phase lock between the reference signal and the first generated signal.

4. The method of claim 3, wherein the step of processing the first count value comprises the step of computing the first control signal in response to the first phase correction signal by a discrete time digital process.

5. The method of claim 1, wherein the step of generating the second generated signal comprises the steps of:

producing the second generated signal in a second controlled oscillator operating at the second frequency, as determined by a second control signal;

frequency dividing the second generated signal by N to produce the sampler signal, wherein N is a second integer value equal to the second frequency divided by the reference frequency;

recording from the shared counter the second count value coincident with the predetermined transition of the sampler signal; and processing the second count value in a second controller to generate the second control signal.

6. The method of claim 5, wherein the step of processing the second count value comprises the steps of:

decoding the second count value to derive a second sequential state number $S_2$ corresponding to the second count value; and determining the second phase correction signal corresponding to the second sequential state number to be $$B(S_2-P_2)/K,$$

wherein B is a predetermined gain constant, and wherein $P_2$ is a second predetermined sequential state number corresponding to a desired point of phase lock between the reference signal and the second generated signal.

7. The method of claim 6, wherein the step of processing the second count value comprises the step of computing the second control signal in response to the second phase correction signal by performing a discrete time digital process.

8. An apparatus for producing a plurality of generated signals operating at a plurality of generated frequencies that are integer multiples of a reference frequency at which a reference signal operates, the apparatus comprising:

a phase error detector coupled to the reference signal and coupled to a sampler signal operating at a sampler frequency and derived from a second generated signal, the phase error detector comprising a shared counter coupled to a first generated signal;

a first phase lock loop coupled to the phase error detector for generating the first generated signal operating at a first frequency; and a second phase lock loop coupled to the phase error detector for simultaneously generating the second generated signal operating at a second frequency, wherein the shared counter counts transitions of the first generated signal, and wherein, coincident with a predetermined edge of the reference signal, the phase error detector produces a first count value representing a first phase correction signal for correcting the first frequency, and wherein the phase error detector further produces, coincident with a predetermined transition of the sampler signal, a second count value representing a second phase correction signal for correcting the second frequency.

9. The apparatus of claim 8, wherein first phase lock loop comprises:

a first controlled oscillator coupled to a first control signal for producing the first generated signal operating at the first frequency, as determined by the first control signal; and a first controller coupled to the first controlled oscillator and coupled to a first register, the first controller for processing the first count value to generate the first control signal, and wherein the phase error detector comprises the first register coupled to the shared counter and coupled to the reference signal for recording the first count value coincident with the predetermined edge of the reference signal.

10. The apparatus of claim 9, wherein the shared counter has K sequential states, K being a first integer value equal to the first frequency divided by the reference frequency, and wherein the first controller comprises:

a first decoder coupled to the first register for decoding the first count value to derive a first sequential state number $S_1$ corresponding to the first count value; and a first processor coupled to the first decoder for determining the first phase correction signal corresponding to the first sequential state number to be $$A(S_1-P_1)/K,$$

wherein A is a predetermined gain constant, and wherein $P_1$ is a first predetermined sequential state number corresponding to a desired point of phase lock between the reference signal and the first generated signal.

11. The apparatus of claim 10, wherein the first processor is programmed for computing the first control signal in response to the first phase correction signal by performing a discrete time digital process.

12. The apparatus of claim 8, wherein the phase error detector comprises a second register coupled to the shared counter for recording the second count value coincident with the predetermined transition of the sampler signal, and wherein the second phase lock loop comprises:

a second controlled oscillator coupled to a second control signal for producing the second generated signal operating at the second frequency, as determined by the second control signal;

a frequency divider coupled to the second controlled oscillator and coupled to the second register, the frequency divider for frequency dividing the second generated signal by N to produce the sampler signal, wherein N is a second integer value equal to the second frequency divided by the reference frequency; and a second controller coupled to the second register and coupled to the second controlled oscillator for processing the second count value to generate the second control signal.

13. The apparatus of claim 12, wherein the second controller comprises:

a second decoder coupled to the second register for decoding the second count value to derive a second sequential state number $S_2$ corresponding to the second count value; and a second processor coupled to the second decoder for determining the second phase correction signal corresponding to the second sequential state number to be $$B(S_2-P_2)/K,$$

wherein B is a predetermined gain constant, and wherein $P_2$ is a second predetermined sequential state number corresponding to a desired point of phase lock between the reference signal and the second generated signal.

14. The apparatus of claim 13, wherein the second processor is programmed for computing the second control signal in response to the second phase correction signal by performing a discrete time digital process.

15. A communication receiver, comprising:

an antenna for intercepting a radio signal including a message;

a receiver element coupled to the antenna for demodulating the message;

a processor coupled to the receiver element for processing the message;

a user control coupled to the processor for providing control of the communication receiver by a user; and a display coupled to the processor for displaying the message, wherein the receiver element includes:

a reference oscillator for generating a reference signal operating at a reference frequency; and a frequency synthesizer for producing a plurality of generated signals operating at a plurality of generated frequencies that are integer multiples of the reference frequency, the frequency synthesizer comprising:

a phase error detector coupled to the reference signal and coupled to a sampler signal operating at a sampler frequency and derived from a second generated signal, the phase error detector comprising a shared counter coupled to a first generated signal;

a first phase lock loop coupled to the phase error detector for generating the first generated signal operating at a first frequency; and a second phase lock loop coupled to the phase error detector for simultaneously generating the second generated signal operating at a second frequency, wherein the shared counter counts transitions of the first generated signal, and wherein, coincident with a predetermined edge of the reference signal, the phase error detector produces a first count value representing a first phase correction signal for correcting the first frequency, and wherein the phase error detector further produces, coincident with a predetermined transition of the sampler signal, a second count value representing a second phase correction signal for correcting the second frequency.

16. The communication receiver of claim 15, wherein first phase lock loop comprises:

a first controlled oscillator coupled to a first control signal for producing the first generated signal operating at the first frequency, as determined by the first control signal; and a first controller coupled to the first controlled oscillator and coupled to a first register, the first controller for processing the first count value to generate the first control signal, and wherein the phase error detector comprises the first register coupled to the shared counter and coupled to the reference signal for recording the first count value coincident with the predetermined edge of the reference signal.

17. The communication receiver of claim 16, wherein the shared counter has K sequential states, K being a first integer value equal to the first frequency divided by the reference frequency, and wherein the first controller comprises:

a first decoder coupled to the first register for decoding the first count value to derive a first sequential state number $S_1$ corresponding to the first count value; and a first processor coupled to the first decoder for determining the first phase correction signal corresponding to the first sequential state number to be $A(S_1-P_1)/K,$ wherein A is a predetermined gain constant, and wherein $P_1$ is a first predetermined sequential state number corresponding to a desired point of phase lock between the reference signal and the first generated signal.

18. The communication receiver of claim 17, wherein the first processor is programmed for computing the first control signal in response to the first phase correction signal by performing a discrete time digital process.

19. The communication receiver of claim 15, wherein the phase error detector comprises a second register coupled to the shared counter for recording the second count value coincident with the predetermined transition of the sampler signal, and wherein the second phase lock loop comprises:

a second controlled oscillator coupled to a second control signal for producing the second generated signal operating at the second frequency, as determined by the second control signal;

a frequency divider coupled to the second controlled oscillator and coupled to the second register, the frequency divider for frequency dividing the second generated signal by N to produce the sampler signal, wherein N is a second integer value equal to the second frequency divided by the reference frequency; and a second controller coupled to the second register and coupled to the second controlled oscillator for processing the second count value to generate the second control signal.

20. The communication receiver of claim 19, wherein the second controller comprises:

a second decoder coupled to the second register for decoding the second count value to derive a second sequential state number $S_2$ corresponding to the second count value; and a second processor coupled to the second decoder for determining the second phase correction signal corresponding to the second sequential state number-to be $B(S_2-P_2)/K,$ wherein B is a predetermined gain constant, and wherein $P_2$ is a second predetermined sequential state number corresponding to a desired point of phase lock between the reference signal and the second generated signal.

21. The communication receiver of claim 20, wherein the second processor is programmed for computing the second control signal in response to the second phase correction signal by performing a discrete time digital process.

* * * * *